(12) United States Patent
Kim (10) Patent No.: US 10,917,598 B2
(45) Date of Patent: Feb. 9, 2021

(54) RAMP SIGNAL GENERATOR AND IMAGE SENSOR INCLUDING THE SAME

(71) Applicant: SK hynix Inc., Gyeonggi-do (KR)

(72) Inventor: Tae Gyu Kim, Gyeonggi-do (KR)

(73) Assignee: S K hynix Inc., Icheon-si (KR)

( * ) Notice: Subject to any disclaimer, the term of this patent is extended or adjusted under 35 U.S.C. 154(b) by 58 days.

(21) Appl. No.: 16/219,873

(22) Filed: Dec. 13, 2018

(65) Prior Publication Data
US 2020/0099882 A1  Mar. 26, 2020

(51) Int. Cl.
| H04N 5/225 | (2006.01) |
| H04N 5/3745 | (2011.01) |
| H01L 27/146 | (2006.01) |
| H04N 9/04 | (2006.01) |
| H04N 5/376 | (2011.01) |

(52) U.S. Cl.
CPC ... *H04N 5/37455* (2013.01); *H01L 27/14643* (2013.01); *H04N 5/3765* (2013.01); *H04N 9/045* (2013.01)

(58) Field of Classification Search
CPC .................................................. H04N 5/378
See application file for complete search history.

(56) References Cited

U.S. PATENT DOCUMENTS

| 9,935,633 | B2 | 4/2018 | Tamura | |
| 2006/0049334 | A1* | 3/2006 | Henderson | H03M 1/1023 250/208.1 |
| 2008/0136948 | A1* | 6/2008 | Muramatsu | H04N 5/335 348/294 |
| 2010/0208112 | A1* | 8/2010 | Lim | G11C 7/106 348/294 |
| 2011/0025900 | A1* | 2/2011 | Kondo | H04N 5/378 348/308 |
| 2014/0014815 | A1* | 1/2014 | Lee | H04N 5/378 250/208.1 |
| 2014/0036124 | A1* | 2/2014 | Higuchi | H04N 5/3658 348/302 |
| 2014/0313385 | A1* | 10/2014 | Sato | H04N 5/3765 348/302 |
| 2014/0319325 | A1* | 10/2014 | Kawahito | H03M 1/0646 250/208.1 |
| 2015/0256782 | A1* | 9/2015 | Wakabayashi | H03M 1/56 250/206 |

(Continued)

*Primary Examiner* — Twyler L Haskins
*Assistant Examiner* — Dwight Alex C Tejano
(74) *Attorney, Agent, or Firm* — Perkins Coie LLP (57) ABSTRACT

A ramp signal generator and an image sensor including the same are disclosed, which relate to technology for allowing a ramp signal generator to reduce voltage drop and current deviation affected by fabrication change. The ramp signal generator includes a ramp array including a plurality of ramp circuits arranged in row and column directions and selectively activated by ramp control signals, and configured to generate an output current by summing currents from selectively activated ramp circuits, and a current-to-voltage converter configured to convert the output current into a voltage value to output the voltage value as a ramp signal. Each of the ramp circuits initializes a voltage of a charge node in response to an initialization voltage, and generates the output current based on charges in a charge transistor charged through the charge node when receiving a drive voltage.

20 Claims, 7 Drawing Sheets

(56) References Cited

U.S. PATENT DOCUMENTS

2016/0286144 A1* 9/2016 Yanai .................. H04N 5/3765
2017/0195601 A1   7/2017 Yun
2019/0098245 A1* 3/2019 Kim ....................... H03M 1/56

* cited by examiner

RAMP SIGNAL GENERATOR AND IMAGE SENSOR INCLUDING THE SAME

CROSS-REFERENCE TO RELATED APPLICATION

This patent document claims the priority and benefits of Korean patent application No. 10-2018-0114019 filed on Sep. 21, 2018, the disclosure of which is incorporated herein by reference.

TECHNICAL FIELD

Embodiments of the present disclosure may generally relate to a ramp signal generator and an image sensor including the same.

BACKGROUND

An image sensor is a photosensitive device that converts light signals into electrical signals. Charged coupled device (CCD) and complementary metal oxide semiconductor (CMOS) image sensor (CIS) are two most common imaging technologies. The CIS dominates in the digital camera market due to its lower power consumption, lower costs, and smaller sizes. Not only that, the CIS technology has recently been extended to a wider scope of applications including video applications that require higher resolution and higher frame rate.

In addition to converting light signals into electrical signals, the CIS converts analog electrical signals (pixel signals) generated from a pixel array into digital electrical signals, and a high-resolution analog-to-digital converter (ADC) performs the analog-to-digital conversion.

In the CIS technology, the correlated double sampling may remove undesired offset by measuring sensor outputs once in a known condition and once in an unknown condition and subtracting the value obtained in the known condition from the value obtained from the unknown condition. For example, the ADC may perform the correlated double sampling on an analog output voltage indicating an output signal of the pixel array, and may store the resultant voltage. Additionally, in response to a ramp signal generated by the ramp signal generator, the ADC may compare the stored voltage obtained by the correlated double sampling operation with a predetermined reference voltage (ramp signal) to obtain a digital code.

However, characteristics of transistors in the ramp signal generator may vary due to semiconductor process variation. In addition, the amount of current may vary depending on the position of a ramp circuit in the ramp signal generator. Therefore, it is important to improve the uniformity of the ramp signal generator to reduce signal distortion.

SUMMARY

This patent document provides, among others, designs of an image sensing device including a ramp signal generator that can improve current uniformity.

The ramp signal generator implemented based on various embodiments of the disclosed technology may improve current uniformity by compensating for threshold voltage characteristics and IR-drop (voltage drop by current and resistor) of transistors.

In an embodiment of the disclosed technology, a ramp signal generator includes a ramp array including a plurality of ramp circuits arranged in row and column directions and coupled to receive ramp control signals that operate to selectively ramp circuits, the ramp array configured to generate an output current by summing currents from selectively activated ramp circuits, and a current-to-voltage converter coupled to ramp array to receive the output current and configured to convert the output current into a voltage value to output the voltage value as a ramp signal. Each ramp circuits includes a charge transistor and a charge node coupled for the charge transistor to generate the output current based on charges in the charge transistor charged through the charge node when receiving a drive voltage and wherein the charge node in initialized in response to an initialization voltage applied to the charge node.

In another embodiment of the disclosed technology, an image sensor includes a pixel array configured to output a plurality of pixel signals corresponding to incident light, a ramp signal generator configured to generate a ramp signal, and an analog-to-digital converter (ADC) configured to convert the plurality of pixel signals into a digital signal in response to the ramp signal. The ramp signal generator includes a ramp array including a plurality of ramp circuits, configured to generate an output current when the ramp circuits are selectively activated by ramp control signals, and a current-to-voltage converter configured to convert the output current into a voltage value to output the voltage value as the ramp signal. Each of the plurality of ramp circuits may initializes a voltage of a charge node in response to an initialization voltage, and may generate the output current based on charges in a charge transistor charged through the charge node when receiving a drive voltage.

In another embodiment of the disclosed technology, a ramp signal generator including a plurality of unit ramp circuit, each unit ramp circuit includes a current output circuit that outputs current generated by each unit ramp circuit, the current output circuit being coupleable to a drive voltage generator for driving each unit ramp circuit, a drive transistor coupleable to the drive voltage generator to receive a drive voltage from the drive voltage generator to sample an adjusted drive voltage by adjusting the drive voltage by a threshold voltage of the drive transistor, and a voltage storage circuit coupleable to the drive transistor to store the adjusted drive voltage. The drive transistor produces threshold-voltage-canceled current by using the adjusted drive voltage. Each unit ramp circuit uses the adjusted drive voltage stored in the voltage storage circuit as a drive voltage supply for each unit ramp circuit to produce current for generating a ramp voltage. The drive transistor adjusts the drive voltage by the threshold voltage of the drive transistor when the drive transistor becomes diode connected.

In another embodiment of the disclosed technology, a ramp signal generator includes a ramp array provided with a plurality of ramp circuits arranged in row and column directions, the plurality of ramp circuits being selectively activated by ramp control signals, and configured to generate an output current by selective activation of the plurality of ramp circuits, and a current-to-voltage converter configured to convert the output current into a voltage value, and output the voltage value as a ramp signal. Each of the ramp circuits may initialize a voltage of a charge node in response to an initialization voltage, and may generate the output current in response to a current charged in a charge transistor through the charge node when receiving a drive voltage.

In another embodiment of the disclosed technology, an image sensor includes a pixel array configured to output a plurality of pixel signals corresponding to incident light, a ramp signal generator configured to generate a ramp signal, and an analog-to-digital converter (ADC) configured to convert the plurality of pixel signals into a digital signal in response to the ramp signal. The ramp signal generator includes a ramp array provided with a plurality of ramp circuits, configured to generate an output current when the plurality of ramp circuits are selectively activated by ramp control signals, and a current-to-voltage converter configured to convert the output current into a voltage value, and output the voltage value as the ramp signal. Each of the plurality of ramp circuits may initialize a voltage of a charge node in response to an initialization voltage, and may generate the output current in response to a current charged in a charge transistor through the charge node when receiving a drive voltage.

BRIEF DESCRIPTION OF THE DRAWINGS

The above and other features and advantages of the present disclosure will become readily apparent by reference to the following detailed description when considered in conjunction with the accompanying drawings wherein.

DETAILED DESCRIPTION

Figure 1:
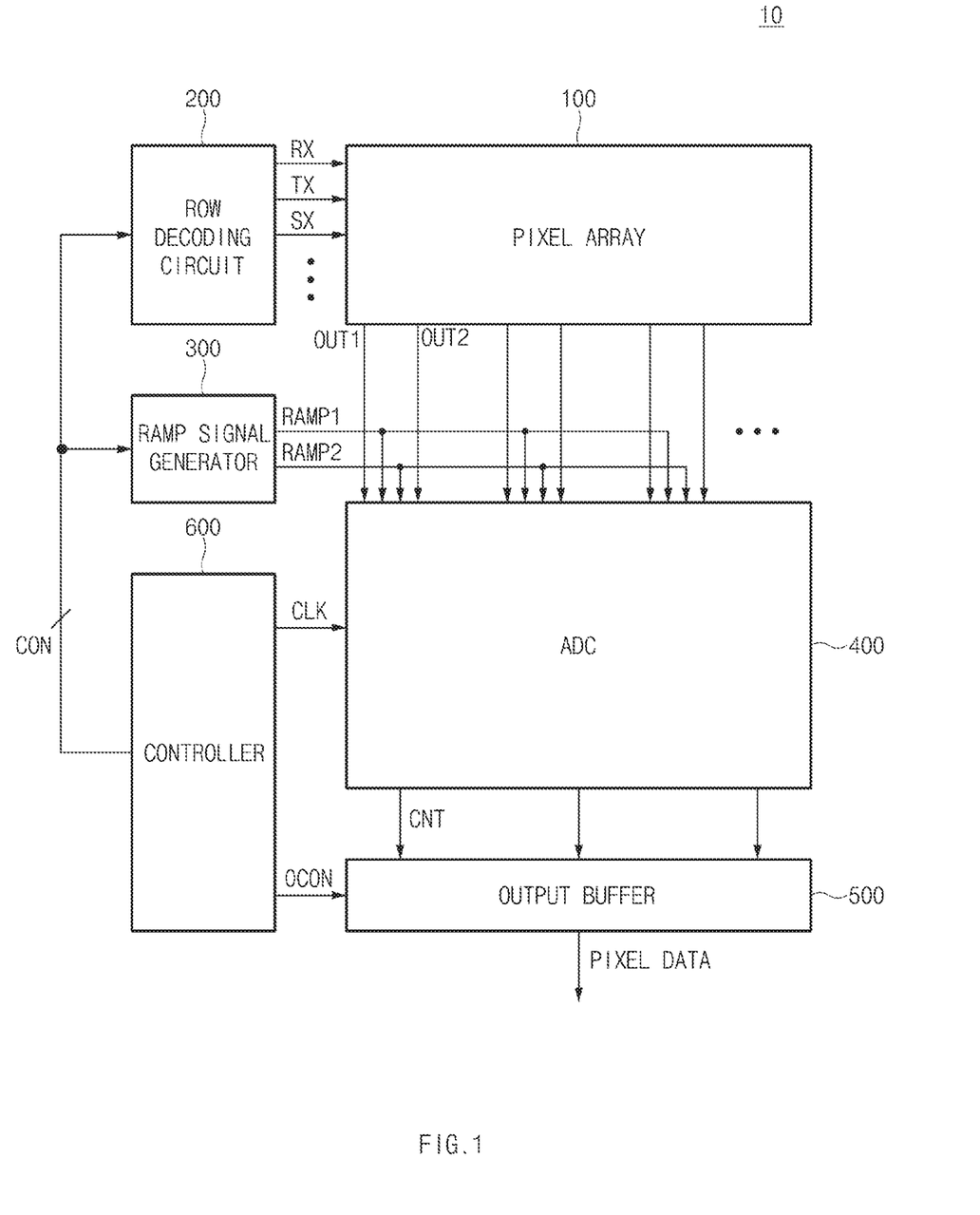
FIG. 1 is a representation of an example of an image sensor including a ramp signal generator implemented based on an embodiment of the disclosed technology.

FIG. 1 shows an example of an image sensor 10 implemented based on an embodiment of the disclosed technology.

Referring to FIG. 1, the image sensor 10 may include a pixel array 100, a row decoding circuit 200, a ramp signal generator 300, an analog-to-digital converter (ADC) 400, an output buffer 500, and a controller 600.

A pixel array 100 may convert an incident optical signal into an electrical signal and output pixel signals OUT1 and OUT2 to the ADC 400. Here, the pixel array 100 may operate based on drive signals (such as a reset signal RX, a transmission signal TX, and a selection signal SX) received from the row decoding circuit 200.

Based on a control signal CON provided by the controller 600, the row decoding circuit 200 may select one or more of pixels of the pixel array 100 for each row line, and may control the selected pixels.

Based on the control signal CON provided by the controller 600, the ramp signal generator 300 may generate ramp signals RAMP1 and RAMP2, and may output the generated ramp signals RAMP1 and RAMP2 to the ADC 400. In an example embodiment of the disclosed technology, the ramp signal generator 300 may generate one pair of ramp signals RAMP1 and RAMP2.

A ramp voltage generator implemented in a semiconductor image sensor may have an array of ramp unit cells for ramp voltage generation. It is desirable that the power supply in the array of ramp unit cells be uniformly distributed throughout metal layers across the entire array of ramp unit cells. In actual devices, however, the power supply (such as the actual applied voltage) may vary with the locations of ramp unit cells within the array of ramp unit cells due to various factors including variations in fabrication of the ramp unit cells and the resistance of the metal layers that changes with the location. When a voltage is applied to a metal layer, the corresponding electric current starts flowing through the metal layer, and a voltage drop occurs due to the resistance of the metal layer which is referred to as an IR drop. In an embodiment of the disclosed technology, the ramp signal generator 300 may be designed and operated to compensate for variations in transistor threshold voltage characteristics and IR drop of one or more ramp circuits, thus improving the current uniformity within the array of ramp unit cells.

The ADC 400 may convert analog pixel signals OUT1 and OUT2 generated by imaging pixels of the pixel array 10 into digital signals. The ADC 400 may compare pixel signals OUT1 and OUT2 generated by the imaging pixels of the pixel array 100 with ramp signals RAMP1 and RAMP2 received from the ramp signal generator 300. Based on the comparison result obtained by comparing the pixel signals OUT1 and OUT2 with the ramp signals RAMP1 and RAMP2, the ADC 400 may output a column-based counting signal CNT by counting a number of clock signals CLK received from the controller 600 while the pixel signals OUT1 and OUT2 are larger than the ramp signals RAMP1 and RAMP2 or while the pixel signals OUT1 and OUT2 are smaller than the ramp signals RAMP1 and RAMP2.

Therefore, the ramp signals RAMP1 and RAMP2 to the ADC 400 are important signals based on which the ramp signal column-based counting signal CNT is generated. Notably, the ramp signal column-based counting signal CNT further impacts the digital conversion of the analog pixel signals from the imaging pixels in the pixel array 100. Accordingly, any inaccuracy or deviation from the desired signal level of each of the ramp signals RAMP1 and RAMP2 can adversely affect the analog-to-digital conversion by the ADC 400, thus degrading the imaging operation of the imaging sensing operation. As further explained in later sections of this patent document, the disclosed technology can be implemented to provide mechanisms inside the ramp signal generator 300 that improve the accuracy of ramp signals RAMP1 and RAMP2 from the ramp signal generator 300.

The output buffer 500 may receive the counting signal CNT from the ADC 400. The output buffer 500 may hold counting information such as the counting signal CNT, and may sequentially output pixel data based on the counting information in response to an output control signal OCON.

The controller 600 may control the row decoding circuit 200, the ramp signal generator 300, the ADC 400, and the output buffer 500. The controller 600 may include a timing generator. That is, the controller 600 may control the overall procedure needed to output image data sensed by the image sensor according to timing information.

Figure 2:
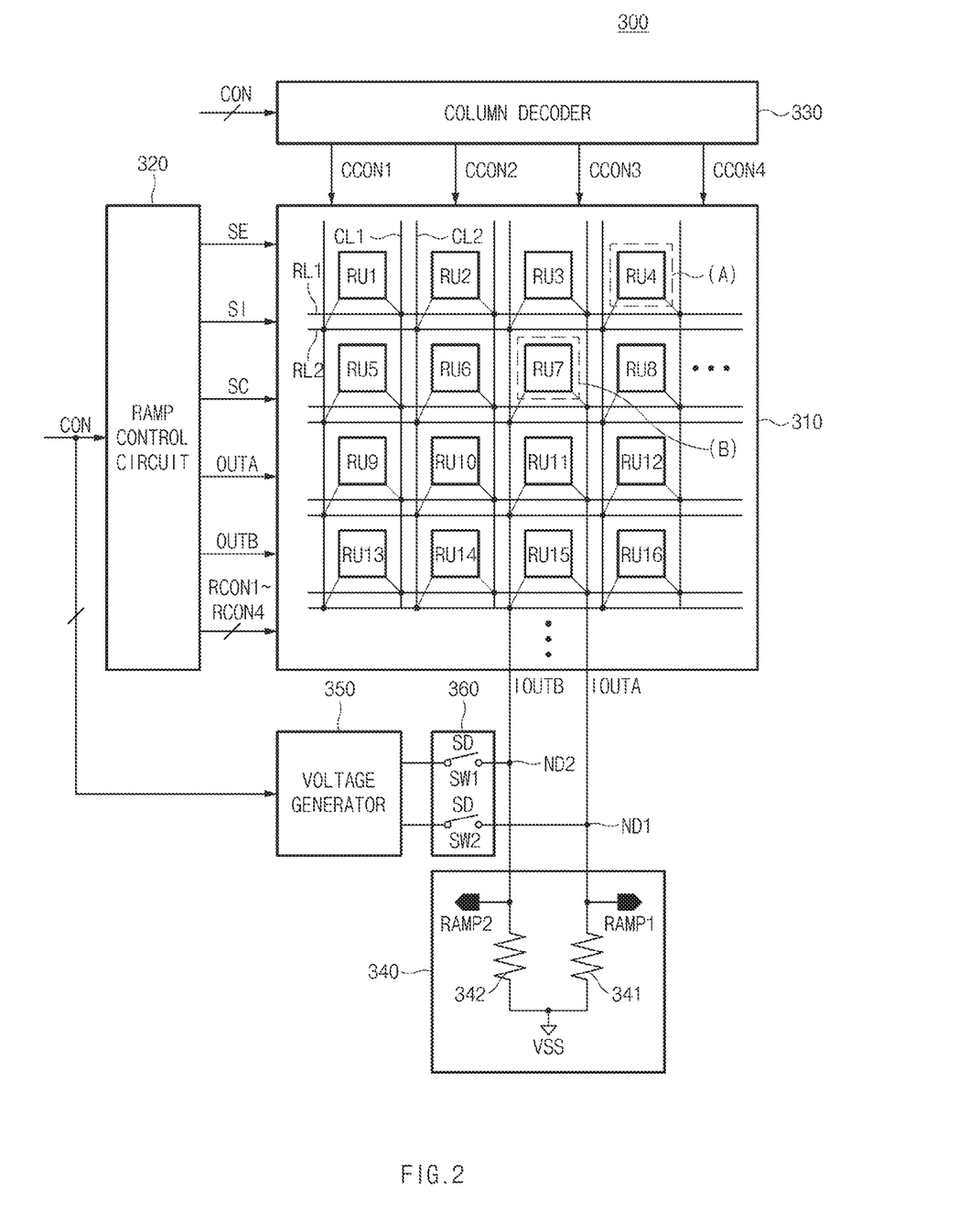
FIG. 2 is a representation of an example of the ramp signal generator shown in FIG. 1.

FIG. 2 is a detailed schematic diagram illustrating an example of the ramp signal generator 300 shown in FIG. 1.

Referring to FIG. 2, the ramp signal generator 300 may include a ramp array 310 of ramp circuits (e.g., RU1-RU16), a ramp control circuit 320 coupled to the ramp array 310, a column decoder 330 coupled to different columns of ramp circuits in the ramp array 310, a current-to-voltage converter 340, a voltage generator 350, and a switching circuit 360.

The ramp array 310 may include a plurality of ramp circuits RU1 to RU16 arranged in row and column directions. The ramp circuits RU1 to RU16 may be coupled to row lines RL1 and RL2 and column lines CL1 and CL2.

The ramp array 310 may select row lines RL1 and RL2 in response to row control signals RCON1 to RCON4, and may select column lines CL1 and CL2 in response to column control signals CCON1 to CCON4. That is, the ramp circuits RU1 to RU16 may be activated by a row line selected from among a plurality of row lines, and may be activated by a column line selected from among a plurality of column lines.

The row line RL1 and the column line CL1 implemented in the ramp array 310 may be coupled to a node ND1 coupled to the ramp circuit array 310, the current-to-voltage converter 340 and the switching circuit 360, and the row line RL2 and the column line CL2 implemented in the ramp array 310 may be coupled to a node ND2 coupled to the ramp circuit array 310, the current-to-voltage converter 340 and the switching circuit 360. In this example, the ramp circuits RU1 to RU16 in the ramp array 310 may be coupled in common to the nodes ND1 and ND2 through the row lines RL1 and RL2 and the column lines CL1 and CL2. In an embodiment of the disclosed technology, the row line RL1 is coupled to the column line CL1, and both are coupled to the node ND1, and the row line RL2 is coupled to the column line CL2, and both are coupled to the node ND2. Therefore, output currents IOUTA and IOUTB acquired by the sum of a plurality of unit currents generated by the plurality of ramp circuits RU1 to RU16 may be supplied to the current-to-voltage converter 340.

In an embodiment of the disclosed technology, the plurality of ramp circuits RU1 to RU16 may be sequentially activated. In another embodiment of the disclosed technology, the plurality of ramp circuits RU1 to RU16 may be sequentially deactivated.

In another embodiment of the disclosed technology, the plurality of row lines of the pixel array 310 may be sequentially activated. During activation of the row line selected from the pixel array 310, the plurality of column lines may be sequentially activated.

In still another embodiment, the plurality of column lines may be sequentially activated. During activation of the column line selected from the pixel array 310, the plurality of row lines may be sequentially activated.

The ramp circuits RU1 to RU16 may apply output currents IOUTA, which sequentially increase in amplitude as time passes, to the current-to-voltage converter 340. The ramp circuits RU1 to RU16 may supply output currents IOUTB, which sequentially decrease in amplitude as time passes, to the current-to-voltage converter 340. Although the example described above illustrates an embodiment in which the output currents IOUTA increase and the output currents IOUTB decrease for convenience of description, it should be noted that the output currents IOUTA may decrease and the output currents IOUTB may increase in certain operations or implementations.

If any one (e.g., the ramp circuit RU1) of the ramp circuits RU1 to RU16 is activated, the ramp circuit RU1 may continuously provide a unit current until next reset. For example, when the column control signals CCON1 to CCON4 are sequentially activated during activation of the row line RL1, the ramp circuits RU1 to RU4 may be sequentially activated.

Although the column control signal CCON2 is activated, the ramp circuit RU1 may remain activated until next reset to continuously provide a unit current, which can be summed with unit currents generated by other ramp circuits. Therefore, output currents IOUTA of the ramp circuits RU1 to RU16 may sequentially increase.

The ramp control circuit 320 may generate row control signals (e.g., RCON1 to RCON4) for selecting row lines (e.g., RL1 and RL2) in response to a control signal CON from the controller 600. The ramp control circuit 320 may reset the ramp array 310 in response to the control signal CON.

The column decoder 330 may generate column control signals CCON1 to CCON4 for selecting column lines CL1 and CL2 in response to a control signal CON of the controller 600. Here, the ramp control circuit 320 may selectively activate the row control signals RCON1 to RCON4, and the column decoder 330 may selectively activate the column control signals CCON1 to CCON4 based on the control signal CON received from a timing controller of the controller 600.

As described above, during activation of the ramp circuits RU1 to RU16, the respective ramp circuits RU1 to RU16 may provide unit currents of the same amplitude or magnitude, respectively. However, the IR drop may occur and such IR drop may vary from location by location based on the position of each of the ramp circuits RU1 . . . , or RU16 relative to the power supply.

Changes in threshold voltages of transistors in the respective ramp circuits RU1 to RU16 caused by variations in fabrication parameters may result in a deviation in current generated by the respective ramp circuits RU1 to RU16. Since the ramp signal generator 300 includes a large number of ramp circuits including the ramp circuits illustrated in FIG. 2, therefore, even a small deviation in each ramp circuit may cause a substantial effect, in the aggregate, on the signal integrity. As a result of this current deviation in the respective ramp circuits RU1 to RU16 induced by the fabrication issues, signal distortion may occur, and this can harm image quality of the image sensor.

For example, among a plurality of ramp circuits in the ramp array 310, the ramp circuit RU4 located in an edge region labeled with "(A)" may be located closer to a power-supply line (not shown in FIG. 2) than the ramp circuit RU7 located in a center region labeled with "(B)." Therefore, the voltage drop from the power-supply line at the ramp circuit RU7 can be larger than the voltage drop at the ramp circuit RU4.

In this case, the amplitude of current output from the ramp circuit RU7 may be relatively lower than the amplitude of current output from the ramp circuit RU4. Therefore, output current of the respective ramp circuits RU1 to RU16 may vary depending on where they are located.

The ramp control circuit 320 implemented based on some embodiments of the disclosed technology may generate ramp control signals SE, SI, SC, VBS, OUTA, and OUTB to compensate for the variation in threshold voltage characteristics and IR drop of transistors in the ramp circuits RU1 to RU16. The ramp control signals SE, SI, SC, VBS, OUTA, and OUTB will be described in more detail later.

The current-to-voltage converter 340 may convert output currents IOUTA and IOUTB of the ramp array 310 into voltage values, and may output the voltage values as the ramp signals RAMP1 and RAMP2. The current-to-voltage converter 340 may include load resistors 341 and 342 coupled between a ground voltage terminal VSS and the nodes ND1 and ND2. In an embodiment of the disclosed technology, each of the loads 341 and 342 may be a fixed resistor or a variable resistor.

The voltage generator 350 may provide a drive voltage having a predetermined level to the nodes ND1 and ND2 in response to the control signal CON. In providing the drive voltage to the nodes ND1 and ND2, the switching circuit 360 may control the application of the drive voltage in response to a ramp control signal SD. Here, the ramp control signal SD may be selectively activated in response to the control signal CON. The switching circuit 360 may include switches SW1 and SW2, which operate in response to the ramp control signal SD. For example, switches SW1 and SW2 of the switching circuit 360 are turned on during activation of the ramp control signal SD, such that a drive voltage of the voltage generator 350 may be applied to the nodes ND1 and ND2. On the other hand, switches SW1 and SW2 of the switching circuit 360 are turned off during deactivation of the ramp control signal SD, such that a drive voltage of the voltage generator 350 may not be applied to the nodes ND1 and ND2.

Figure 3:
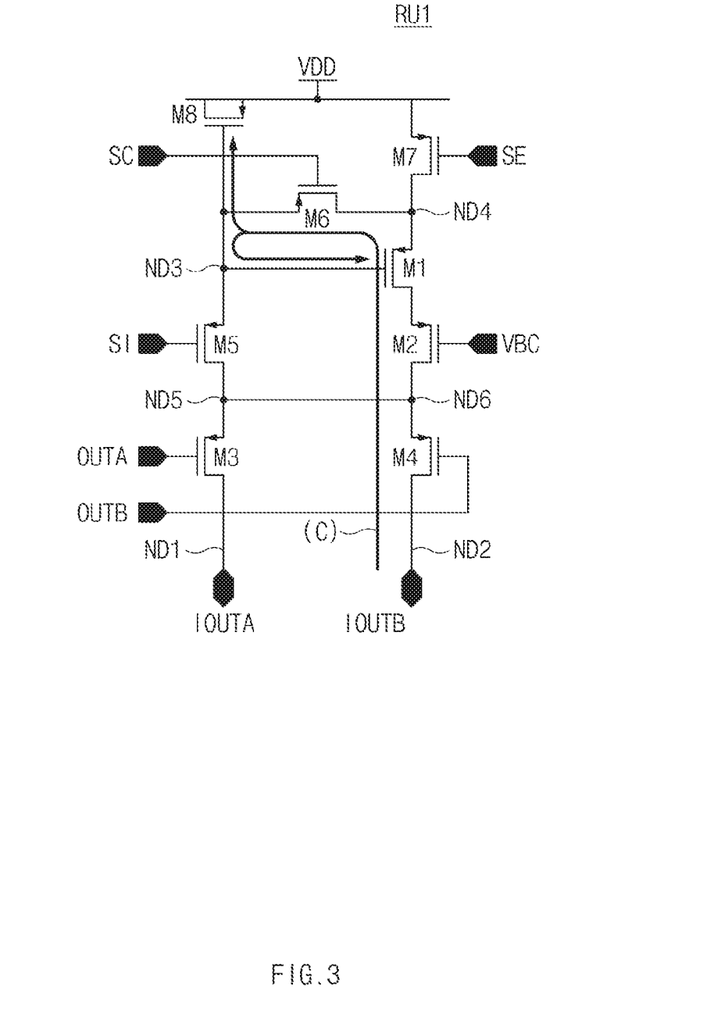
FIG. 3 is a representation of an example of a unit ramp circuit shown in FIG. 2.

FIG. 3 is a detailed circuit diagram illustrating an example of the unit ramp circuit RU1 shown in FIG. 2. Referring to FIG. 3, the plurality of ramp circuits RU1 to RU16 may be identical in structure to each other, and a detailed structure of the first ramp circuit RU1 from among the ramp circuits RU1~RU16 will hereinafter be described with reference to FIG. 3.

The ramp circuit RU1 may include a plurality of transistors M1 to M8 selectively operative in response to the ramp control signals SE, SI, SC, VBS, OUTA, and OUTB.

The transistor M1 may be coupled between the node ND4 and the transistor M2, and a gate terminal of the transistor M1 may be coupled to the node ND3 (charge node). The transistor M2 may be coupled between the transistor M1 and the node ND6, and a gate terminal of the transistor M2 may receive a ramp control signal VBC. The ramp control signal VBC may allow the node ND2 to receive an external drive voltage. In an embodiment of the disclosed technology, the external drive voltage received through the node ND2 may be a drive voltage received from the voltage generator 350.

The transistor M3 may be coupled between the node ND5 and the node ND1, and may have a gate terminal for receiving a ramp control signal OUTA. The transistor M3 may output an output current IOUTA through the node ND1. The ramp control signal OUTA is used to control the output current IOUTA flowing to the current-to-voltage converter 340 through the node ND1.

The transistor M4 may be coupled between the node ND6 and the node ND2, and may have a gate terminal for receiving a ramp control signal OUTB. The transistor M4 may output an output current IOUTB through the node ND2. The ramp control signal OUTB is used to control the output current IOUTB flowing to the current-to-voltage converter 340 through the node ND2.

The transistor M5 may be coupled between the node ND3 and the node ND5, and may have a gate terminal for receiving a ramp control signal SI. The ramp control signal SI may be an initialization signal that is used to initialize the node ND3.

The transistor M6 may be coupled between the node ND3 and the node ND4, and may have a gate terminal for receiving a ramp control signal SC. In some instances, the ramp control signal SC may be used to generate a voltage difference corresponding to a threshold voltage (Vt) of the transistor M1 coupled between the node ND3 and the node ND4.

The transistor M7 may be coupled between the node ND4 and a power-supply voltage (VDD) input terminal, and may have a gate terminal for receiving a ramp control signal SE. The ramp control signal SE may be an enable signal that allows or blocks current connection to the ramp circuit RU1. That is, the transistor M7 may activate or deactivate the ramp circuit RU1 in response to the ramp control signal SE.

A source terminal and a drain terminal of the transistor M8 may be coupled to the power-supply voltage (VDD) input terminal, and a gate terminal of the transistor M8 may be coupled to the node ND3. As discussed above, the actual voltage of the power-supply voltage (VDD) applied to each of the ramp circuit RU1-RU16 may vary with the location of the each of the ramp circuits RU1 . . . , or RU16 relative to the location of the power supply of the power-supply voltage (VDD).

The ramp control signal SD may be a drive signal for the voltage generator 350 to apply a drive voltage to the ramp circuit RU1. That is, during activation of the ramp control signal SD, a drive voltage having a predetermined level may be supplied to the ramp circuit RU1 through the nodes ND1 and ND2. The drive voltage supplied from the voltage generator 350 to the ramp circuit RU1 may be used as an initialization voltage to initialize the node ND3.

In the ramp circuit RU1 including the above-mentioned constituent elements, individual transistors M1 to M8 may be selectively turned on or off according to the ramp control signals SE, SI, SC, VBS, OUTA, and OUTB, and output currents IOUTA and IOUTB may be generated to compensate for threshold voltage deviation and IR-drop.

Figure 4:
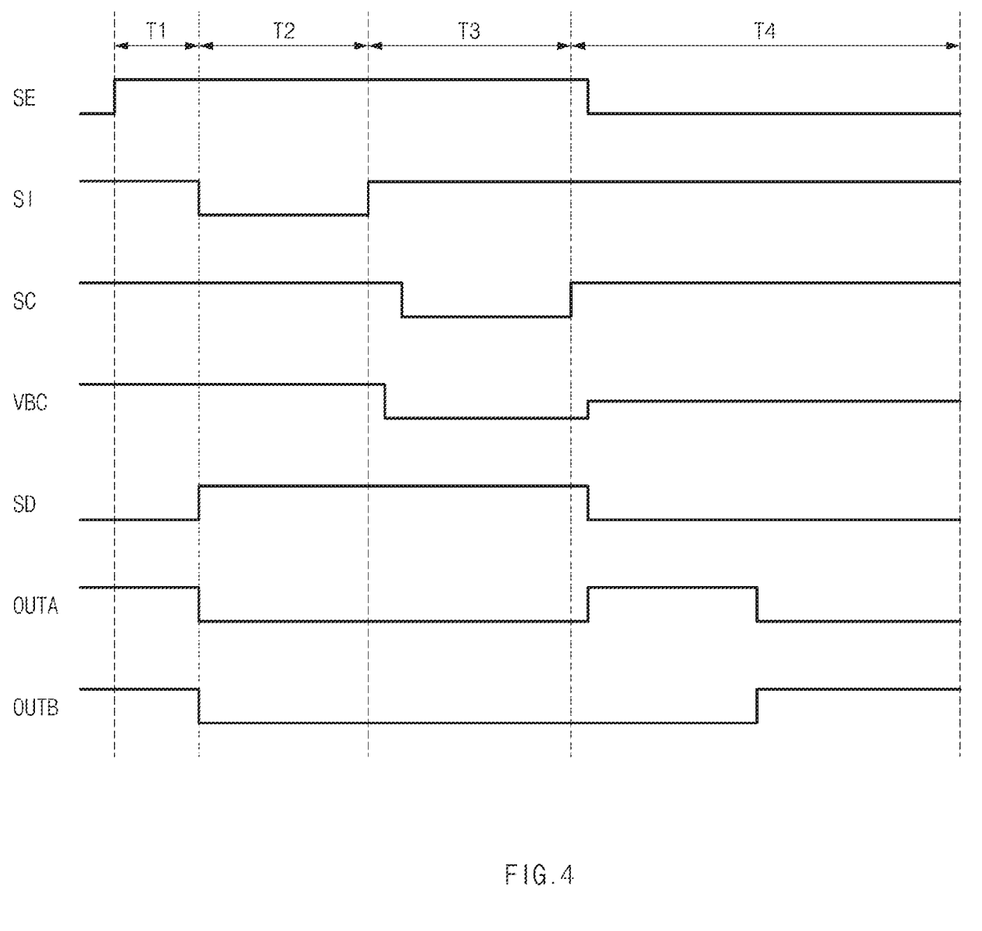
FIG. 4 is a timing diagram illustrating example operations of the ramp signal generator shown in FIG. 2.

Operations of the ramp circuit RU1 shown in FIG. 3 will hereinafter be described with reference to the timing diagram shown in FIG. 4.

In time period T1, the ramp control signals SE, SI, SC, VBS, OUTA, and OUTB are at high levels, and the transistors M1 to M8 remain turned off. When the time period T1 starts, the ramp control signal SE may transition from a low level to a high level to cut off a current flowing to the ramp circuit RU1.

Thereafter, in time period T2, when the ramp control signal SI transitions to a low level, the transistor M5 is turned on. When the ramp control signal SD transitions to a high level, a drive voltage of the voltage generator 350 may be supplied to the ramp circuit RU1 through the nodes ND1 and ND2.

If the ramp control signals OUTA and OUTB transition to a low level, the transistors M3 and M4 may be turned on. As a result, an initialization voltage is supplied from the node ND1 to the node ND3 to initialize the node ND3 based on drive voltage level.

In the time period T2, since the transistors M3 and M5 are turned on, the initialization voltage of the node ND1 may be applied to a gate terminal of the transistor M8 (e.g., charge transistor) via the nodes ND5 and ND3. A drive voltage generated by the voltage generator 350 may be supplied to be used as initialization voltages for all the ramp circuits RU1 to RU16. In an embodiment of the disclosed technology, the same voltage may be used as initialization voltages for all the ramp circuits RU1 to RU16.

Subsequently, in time period T3, the ramp control signal SI may transition to a high level to turn off the transistor M5 again. The ramp control signal VBC transitions to a low level to turn on the transistor M2. The ramp control signal SC transitions to a low level to turn on the transistor M6. In addition, if the ramp control signal SE is at a high level, the transistor M7 remains turned off. As a result, the node ND3 and the node ND4 may be coupled to each other. Accordingly, a current path may be formed through the nodes ND2, ND6, ND4, and ND3. The current path may be denoted by "(C)" as shown in FIG. 3.

A current path is established along a gate terminal and a source terminal of the transistor M1, such that the transistor M1 may have diode characteristics. Therefore, a voltage (gate-source voltage Vgs of the transistor M1) adjusted (that is lower than the drive voltage) from the drive voltage received through the node ND2 by a threshold voltage (Vt) of the transistor M1, may be applied to the node ND3. The voltage applied to the node ND3 of the transistor M1 may be stored in a MOS-capacitor-type transistor M8.

As discussed above, the voltage stored in the transistor M8 has a voltage value that is adjusted by the threshold voltage (Vt) of a drive transistor (e.g., transistor M1) after passing through the time period during which M1 is diode connected. When the ramp circuit RU1 is driven, a current may be generated in response to the voltage stored in the transistor M8. Accordingly, the ramp circuits RU1 to RU16 may have a constant current value irrespective of a change in threshold voltage, resulting in improvement in current uniformity. By using the adjusted voltage as a drive voltage of each ramp circuit to cancel the effect of the threshold voltage on the current generated by each ramp circuit, the plurality of ramp circuits can avoid undesired current variations. Moreover, the drive voltage (e.g., threshold voltage canceled drive voltage) can be sampled and stored in the transistor M8 of each unit ramp circuit to be used as a drive voltage for each unit ramp circuit, thereby avoiding potential IR drop that could have been occurred had a common drive voltage supplier been used for all the unit ramp circuit.

That is, a drive transistor (i.e., transistor M1) may be used as a current source of the ramp unit RU1, and may reduce current distribution caused by distribution of a threshold voltage. The reason why output currents of the ramp units RU1~RU16 are different from each other is that drive transistors contained in the respective ramp units RU1~RU16 have different threshold voltages ($V_{th}$). Accordingly, the embodiment of the present disclosure may supply a voltage value provided with a threshold value ($V_{th}$) of each drive transistor as a gate voltage of the transistor M8, such that threshold values ($V_{th}$) of the respective ramp units RU1~RU16 can be removed.

$$I_{DS}=\tfrac{1}{2}u_p C_{ox} W/L(V_{gs}-V_{th})^2(1+\lambda V_{ds})$$ [Equation 1]

In Equation 1, $I_{DS}$ is a current flowing from a drain terminal of the transistor M1 to a source terminal of the transistor M1. In Equation 1, $V_{gs}$ is a difference in voltage between the gate terminal and the source terminal (i.e., a gate-source voltage difference), ½$u_p$ is a constant value decided in a fabrication process of a PMOS transistor, each of W and L denote the size of a transistor, $C_{ox}$ is the size of a gate oxide film, and λ is a channel length coefficient.

For example, it is assumed that a threshold voltage ($V_{th}$) of the drive transistor (i.e., transistor M1) is set to 0.7V, an initialization voltage (i.e., a voltage supplied to a node ND3 by the voltage generator 350) is set to 3V, and a ramp control signal OUTA is set to 1V. As a result, a voltage of the node ND3 may be changed from 3V to 1.7V. If the threshold voltage ($V_{th}$) of the drive transistor is set to 0.8V, the voltage of the node ND3 may be changed from 3V to 1.8V under the same condition.

In the first case, if the voltage of the node ND3 is set to 1.7V, a gate-source voltage ($V_{gs}$) of the transistor M1 is 1.3V, and a square term (i.e., $(V_{gs}-V_{th})^2$) of Equation 1 is $(0.6)^2$. In the second case, if the voltage of the node ND3 is set to 1.8V, a gate-source voltage ($V_{gs}$) of the transistor M1 is 1.2V, and a square term (i.e., $(V_{gs}-V_{th})^2$) of Equation 1 is $(0.6)^2$. In other words, in a time period T3, a value corresponding to the threshold voltage ($V_{th}$) of the drive transistor may be provided as a gate voltage of the transistor M3.

Therefore, each of the ramp units RU1~RU16 may have a constant current value irrespective of a threshold voltage ($V_{th}$). If a power-supply voltage (VDD) decreases by an IR drop, a value stored in the transistor M3 may also decrease in proportion to the power-supply voltage VDD, such that a value of a square term for deciding an actual current value may remain unchanged. As a result, the embodiment of the present disclosure may maintain a constant output current value irrespective of the IR drop.

Subsequently, in time period T4, when the ramp control signal SC transitions to a high level to cut off the connection between the node ND3 and the node ND4 by turning off the transistor M6. When the ramp control signal SE transitions to a low level, the transistor M7 is turned on to apply a power-supply voltage VDD to the node ND4.

When the ramp control signal VBC transitions to a high level, the transistor M2 is turned off. When the ramp control signal SD transitions to a low level, the drive voltage is not supplied from the voltage generator 350 to the ramp circuit RU1 any longer. Therefore, the drive voltage supplied from the node ND2 to the transistor M1 may be cut off.

When the ramp control signal OUTA transitions to a high level, the transistor M3 is turned off. If the transistor M4 is turned on, the output current IOUTB may be transmitted to the current-to-voltage converter 340. The ramp control signal OUTA transitions to a low level after a predetermined period of time, the ramp control signal OUTB may transition to a high level. As a result, the transistor M3 is turned on again and the transistor M4 is turned off, such that the output current IOUTA may be transmitted to the current-to-voltage converter 340.

Figure 5:
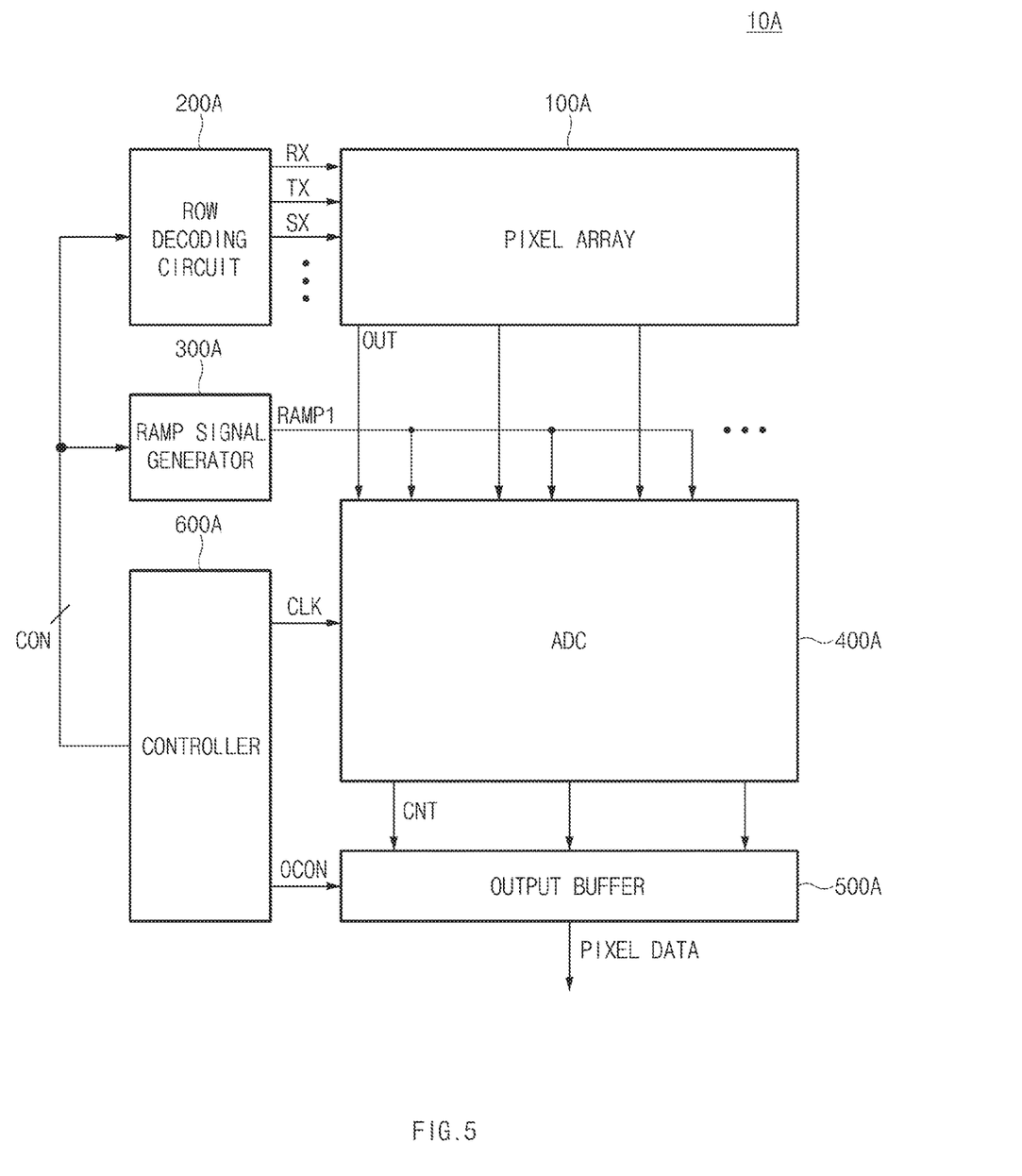
FIG. 5 is a representation of an example of an image sensor including a ramp signal generator implemented based on another embodiment of the disclosed technology.

FIG. 5 is a schematic diagram illustrating an image sensor 10A based on another embodiment of the disclosed technology. The image sensor 10A illustrated in FIG. 5 may have the same constituent elements as those of FIG. 1, and thus a detailed description thereof.

The image sensor 10A implemented based on another embodiment of the disclosed technology may include a pixel array 100A, a row decoding circuit 200A, a ramp signal generator 300A, an analog-to-digital converter (ADC) 400A, an output buffer 500A, and a controller 600A.

While the pixel array 100 of FIG. 1 is designed to output one pair of pixel signals OUT1 and OUT2, the pixel array 100A of FIG. 5 is designed to output only one pixel signal OUT for each column.

While FIG. 1 illustrates a ramp signal generator 300 that outputs one pair of ramp signals RAMP1 and RAM P2, FIG. 5 illustrates a ramp signal generator 300A that outputs only one ramp signal RAMP1.

That is, in FIG. 1, the ADC 400 receives not only one pair of pixel signals OUT1 and OUT2 for each column, but also one pair of ramp signals RAMP1 and RAMP2 for each column to process the received signals. In contrast, in FIG. 5, the ADC 400A receives a single pixel signal OUT and a single ramp signal RAMP for each column to process the received signals OUT and RAMP.

Figure 6:
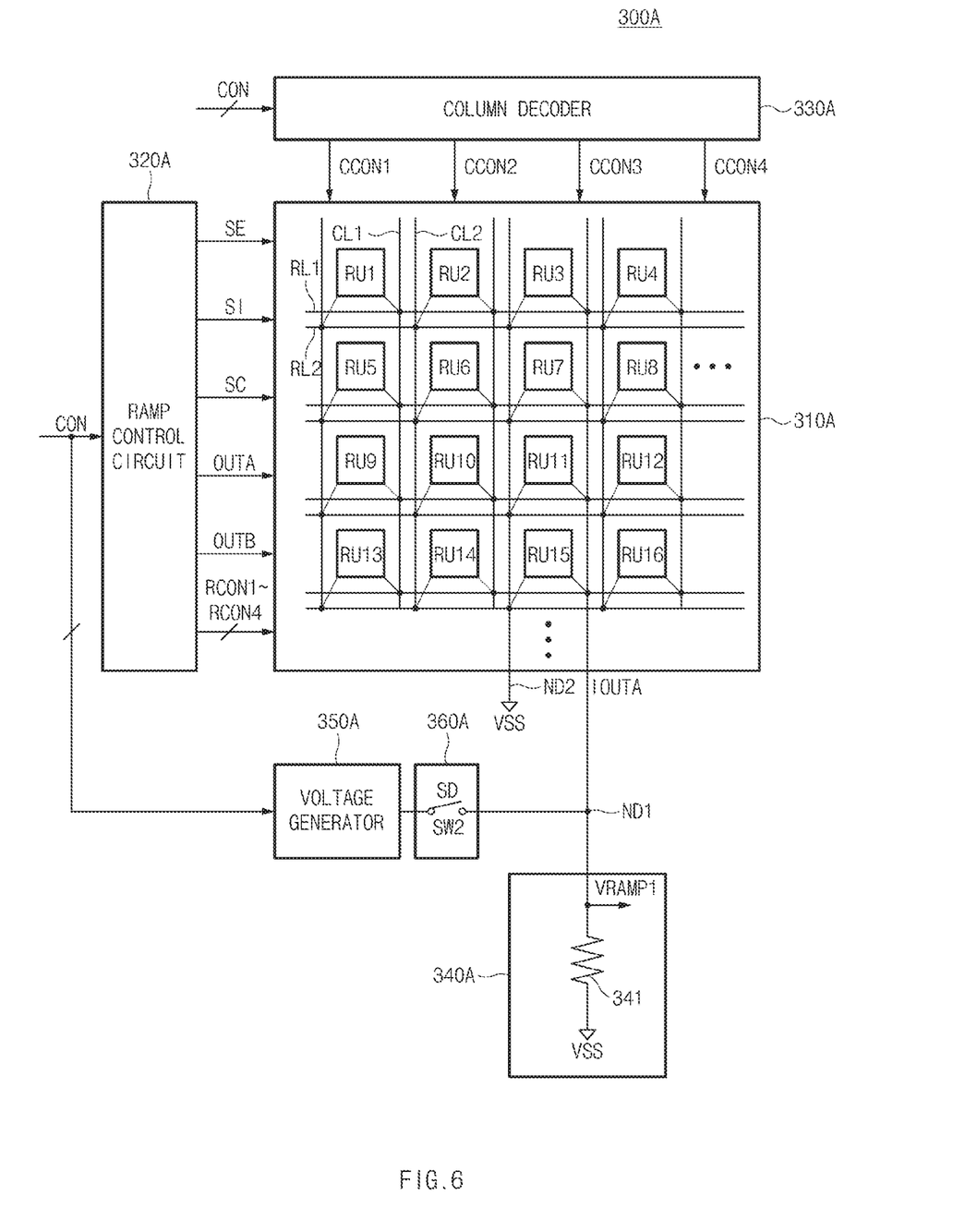
FIG. 6 is a representation of an example of the ramp signal generator shown in FIG. 5.

FIG. 6 is a detailed schematic diagram illustrating the ramp signal generator 300A shown in FIG. 5.

Referring to FIG. 6, the ramp signal generator 300A may include a ramp array 310A, a ramp control circuit 320A, a column decoder 330A, a current-to-voltage converter 340A, a voltage generator 350A, and a switching circuit 360A.

In FIG. 1, the ramp array 310 outputs one pair of output currents IOUTA and IOUTB through the nodes ND1 and ND2. In contrast, as shown in FIG. 6, the ramp array 310A may output only one output current IOUTA through the node ND1, and the node ND2 may be coupled to the ground voltage (VSS) input terminal.

In this case, during the time period T2 in which the ramp control signal SI transitions to a low level, the initialization voltage for initializing the node ND3 may reach the ground voltage (VSS) level. In addition, since a drive voltage of the voltage generator 350A illustrated in FIG. 6 is supplied only to the node ND1, the switching circuit 360A does not need to include more than one switch SW2 therein. Since the ramp generator 300a shown in FIG. 6 is designed to output only one ramp signal RAMP1, the ramp generator 300 does not need to include more than one load resistor 341.

Figure 7:
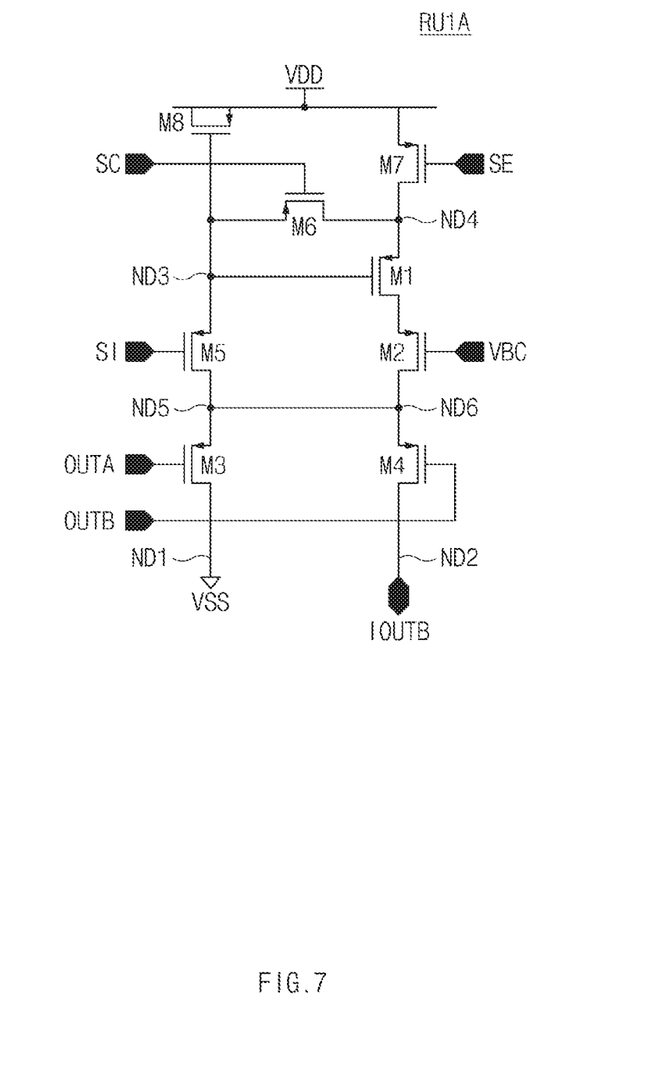
FIG. 7 is a representation of an example of a unit ramp circuit shown in FIG. 6.

FIG. 7 is a detailed circuit diagram illustrating the unit ramp circuit RU1A shown in FIG. 6.

Unlike the unit ramp circuit RU1 shown in FIG. 3, the unit ramp circuit RU1A shown in FIG. 7 is designed in a manner that the output current IOUTA is not output through the node ND1 and the node ND1 is coupled to the ground voltage (VSS) input terminal. Structures and operations of the transistors M1 to M8 in the unit ramp circuit RU1A shown in FIG. 7 are similar or identical to those of FIG. 3, and as such a detailed description thereof will herein be omitted for convenience of description.

As is apparent from the above description, the ramp signal generator and the image sensor including the same implemented based on some embodiments of the disclosed technology can improve current uniformity using the ramp signal generator.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A ramp signal generator comprising:
a ramp array including a plurality of ramp circuits arranged in row and column directions and coupled to receive ramp control signals that operate to selectively activate ramp circuits, the ramp array configured to generate an output current by summing currents from selectively activated ramp circuits; and
a current-to-voltage converter coupled to the ramp array to receive the output current and configured to convert the output current into a voltage value to output the voltage value as a ramp signal,
wherein each ramp circuit includes:
a charge transistor and a charge node coupled to the charge transistor to generate the output current based on charges in the charge transistor charged through the charge node when receiving a drive voltage, and wherein the charge node is initialized in response to an initialization voltage applied to the charge node, wherein the charge transistor configured to store a voltage of the charge node;
a first transistor configured to transmit the initialization voltage to the charge node in response to a first ramp control signal;
a second transistor coupled between a power-supply voltage terminal and a first node, the second transistor being configured to provide a power-supply voltage in response to a second ramp control signal;
a third transistor coupled between the charge node and the first node, the third transistor being configured to operate in response to a third ramp control signal;
a fourth transistor coupled between the first node and the second node, a gate terminal of the fourth transistor being coupled to the charge node; and
a fifth transistor configured to supply the drive voltage to the fourth transistor in response to a fourth ramp control signal.

2. A ramp signal generator comprising:
a ramp array including a plurality of ramp circuits arranged in row and column directions and coupled to receive ramp control signals that operate to selectively activate ramp circuits, the ramp array configured to generate an output current by summing currents from selectively activated ramp circuits; and
a current-to-voltage converter coupled to the ramp array to receive the output current and configured to convert the output current into a voltage value to output the voltage value as a ramp signal,
wherein each ramp circuit includes a charge transistor and a charge node coupled to the charge transistor to generate the output current based on charges in the charge transistor charged through the charge node when receiving a drive voltage, and wherein the charge node is initialized in response to an initialization voltage applied to the charge node,
wherein the ramp circuits in the ramp array are coupled to first and second nodes in common to generate a first output current through the first node by summing a plurality of unit currents generated by the plurality of ramp circuits, and generate a second output current through the second node by summing the plurality of unit currents generated by the plurality of ramp circuits.

3. The ramp signal generator according to claim 2, wherein the first output current sequentially increases as the number of the activated ramp circuits increases.

4. The ramp signal generator according to claim 3, wherein the second output current sequentially decreases as the first output current sequentially increases.

5. The ramp signal generator according to claim 2, wherein the ramp circuits generate the output current through a first node using a sum of a plurality of unit currents.

6. The ramp signal generator according to claim 2, wherein the ramp circuits are sequentially activated.

7. The ramp signal generator according to claim 2, wherein the ramp circuits are sequentially deactivated.

8. The ramp signal generator according to claim 2, wherein each of the plurality of ramp circuits comprises:
the charge transistor configured to store a voltage of the charge node;

a first transistor configured to transmit the initialization voltage to the charge node in response to a first ramp control signal;

a second transistor coupled between a power-supply voltage terminal and a first node, the second transistor being configured to provide a power-supply voltage in response to a second ramp control signal;

a third transistor coupled between the charge node and the first node, the third transistor being configured to operate in response to a third ramp control signal;

a fourth transistor coupled between the first node and the second node, a gate terminal of the fourth transistor being coupled to the charge node; and a fifth transistor configured to supply the drive voltage to the fourth transistor in response to a fourth ramp control signal.

9. The ramp signal generator according to claim 8, wherein, in each of the plurality of ramp circuits:

during activation of the first ramp control signal, the first transistor is turned on such that the initialization voltage is transmitted to the charge transistor through the charge node; and during activation of the third ramp control signal and the fourth ramp control signal, the third transistor and the fifth transistor are turned on to transmit the drive voltage to the fourth transistor, such that the charge transistor is charged with a voltage of the charge node.

10. The ramp signal generator according to claim 8, wherein each of the plurality of ramp circuits is configured in a manner that the second transistor is turned on during activation of the second ramp control signal to apply a current to a corresponding ramp circuit.

11. The ramp signal generator according to claim 8, wherein each of the plurality of ramp circuits comprises:

a sixth transistor configured to output a first output current in response to a fifth ramp control signal; and a seventh transistor configured to output a second output current in response to a sixth ramp control signal.

12. The ramp signal generator according to claim 2, further comprising:

a ramp control circuit configured to generate a row control signal for selecting a row line of the plurality of ramp circuits, and generate the ramp control signals for selectively operating transistors in the plurality of ramp circuits.

13. The ramp signal generator according to claim 2, further comprising:

a column decoder configured to generate a column control signal for selecting a column line of the plurality of ramp circuits.

14. The ramp signal generator according to claim 2, further comprising:

a voltage generator configured to generate the initialization voltage and the drive voltage; and a switching circuit configured to selectively transmit the initialization voltage and the drive voltage in response to a seventh ramp control signal.

15. An image sensor comprising:

a pixel array configured to output a plurality of pixel signals corresponding to incident light;

a ramp signal generator configured to generate a ramp signal; and an analog-to-digital converter (ADC) configured to convert the plurality of pixel signals into a digital signal in response to the ramp signal, wherein the ramp signal generator includes:

a ramp array including a plurality of ramp circuits configured to generate an output current when the ramp circuits are selectively activated by ramp control signals; and a current-to-voltage converter configured to convert the output current into a voltage value to output the voltage value as the ramp signal, wherein each of the plurality of ramp circuits initializes a voltage of a charge node in response to an initialization voltage, and generates the output current based on charges in a charge transistor charged through the charge node when receiving a drive voltage, wherein the ramp circuits are coupled to first and second nodes in common to generate a first output current through the first node by summing a plurality of unit currents generated by the plurality of ramp circuits, and generate a second output current through the second node by summing the plurality of unit currents generated by the plurality of ramp circuits.

16. The image sensor according to claim 15, wherein each of the plurality of ramp circuits comprises:

the charge transistor configured to store a voltage of the charge node;

a first transistor configured to transmit the initialization voltage to the charge node in response to a first ramp control signal;

a second transistor coupled between a power-supply voltage terminal and a first node, the second transistor being configured to provide a power-supply voltage in response to a second ramp control signal;

a third transistor coupled between the charge node and the first node, the third transistor being configured to operate in response to a third ramp control signal;

a fourth transistor coupled between the first node and the second node, a gate terminal of the fourth transistor being coupled to the charge node; and a fifth transistor configured to supply the drive voltage to the fourth transistor in response to a fourth ramp control signal.

17. The image sensor according to claim 16, wherein, in each of the plurality of ramp circuits:

during activation of the first ramp control signal, the first transistor is turned on such that the initialization voltage is transmitted to the charge transistor through the charge node; and during activation of the third ramp control signal and the fourth ramp control signal, the third transistor and the fifth transistor are turned on to transmit the drive voltage to the fourth transistor, such that the charge transistor is charged with a voltage of the charge node.

18. The image sensor according to claim 17, wherein each of the plurality of ramp circuits comprises:

a sixth transistor configured to output a first output current in response to a fifth ramp control signal; and a seventh transistor configured to output a second output current in response to a sixth ramp control signal.

19. The image sensor according to claim 15, further comprising:

a ramp control circuit configured to generate a row control signal for selecting a row line of the plurality of ramp circuits, and generate the ramp control signals for selectively operating transistors in the plurality of ramp circuits.

20. The image sensor according to claim 15, further comprising:

a voltage generator configured to generate the initialization voltage and the drive voltage; and a switching circuit configured to selectively transmit the initialization voltage and the drive voltage in response to a seventh ramp control signal.

* * * * *